United States Patent [19]

Boulanger et al.

[11] 4,320,716

[45] Mar. 23, 1982

[54] ULTRA-HIGH FREQUENCY DEVICE FOR DEPOSITING THIN FILMS ON SOLIDS

[75] Inventors: Philippe Boulanger; Daniel Kaplan; Georges Mourier, all of Paris, France

[73] Assignee: Thomson-CSF, Paris, France

[21] Appl. No.: 150,436

[22] Filed: May 16, 1980

[30] Foreign Application Priority Data

May 18, 1979 [FR] France .............................. 79 12712

[51] Int. Cl.³ .............................................. C23C 13/08
[52] U.S. Cl. .................................. 118/723; 118/50.1; 118/725; 118/728; 118/733
[58] Field of Search ................. 118/50.1, 620, 723, 118/725, 733, 728, 641

[56] References Cited

U.S. PATENT DOCUMENTS 3,297,465  1/1967  Connell et al. .................. 427/57 X
3,886,896  6/1975  Cakenberghe ..................... 118/723

*Primary Examiner*—Bernard D. Pianalto
*Attorney, Agent, or Firm*—Roland Plottel

[57] ABSTRACT

A device having means for forming a high frequency excitation zone in an elongated enclosure, a vacuum pump whose connection is positioned at one end of the enclosure, a device permitting the injection into the enclosure of a gaseous mixture containing at least one compound of the substance to be deposited in the vicinity of but outside the excitation zone. The solid on which the deposit is to be made is positioned in the enclosure. The deposition area on said solid is limited to an area of the enclosure outside the high frequency excitation zone in which the gaseous mixture is almost completely decomposed by high energy particles emitted in said zone.

10 Claims, 4 Drawing Figures

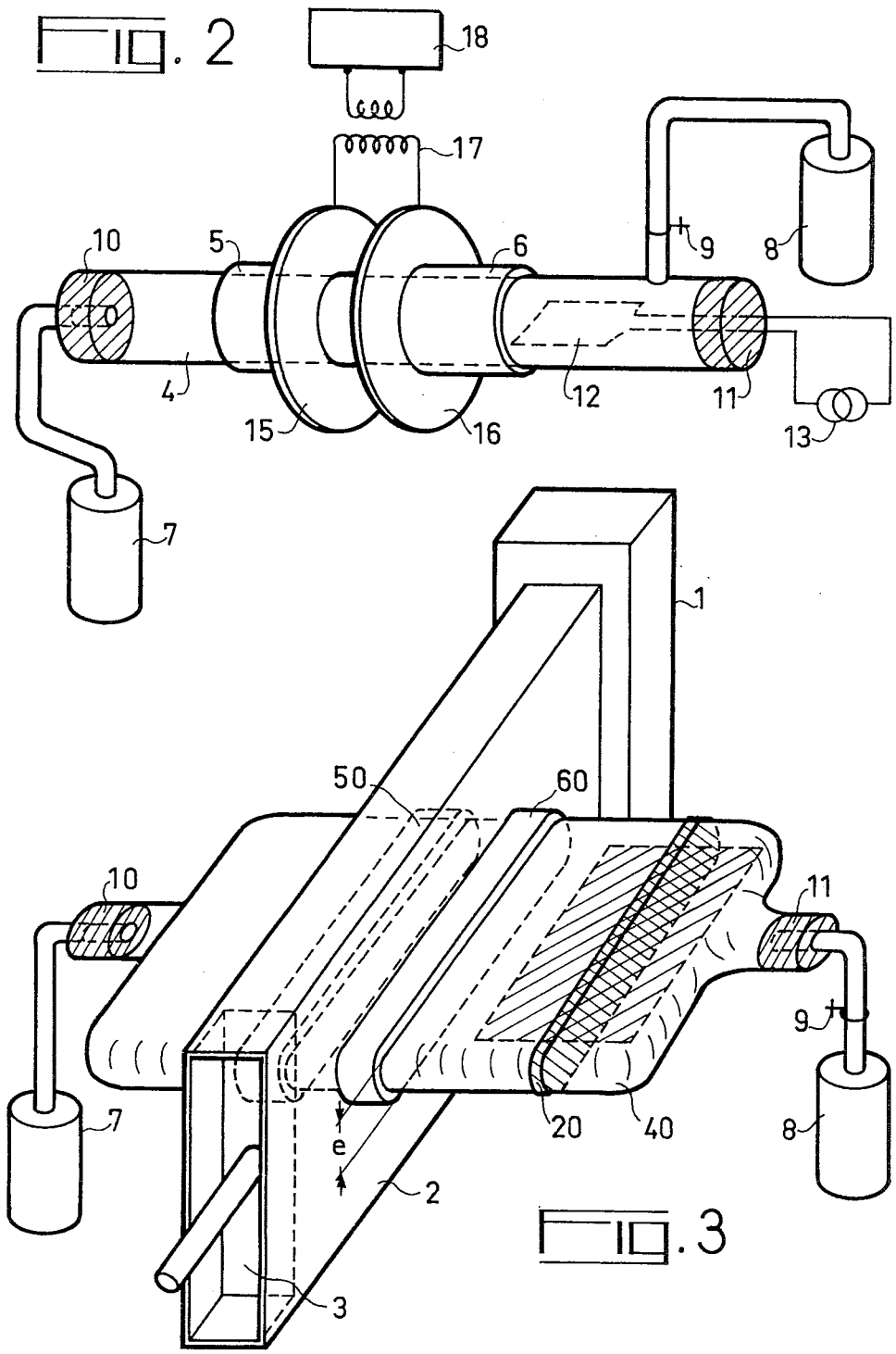

ULTRA-HIGH FREQUENCY DEVICE FOR DEPOSITING THIN FILMS ON SOLIDS

BACKGROUND OF THE INVENTION

The present invention relates to the depositing of thin films and more particularly to an ultra-high frequency device for depositing such thin films on solids.

Numerous applications at present use thin film deposits of different materials on solids. In order to obtain such deposits it is possible to use thermal phenomena in different types of ovens or furnaces. However, it is also possible to use electrical discharges in suitable low pressure gases and in particular high frequency discharges. At present, there is a complete range of depositing devices operating at different frequencies between 0 and 50 MHz for the thin film deposition of various materials on different types of supports.

For example, in order to obtain metal deposits, it is possible to use a vacuum bell jar into which a rare gas is introduced at a suitable pressure, for example argon at a pressure of $10^{-2}$ Torr. Two circular horizontal plates 30 cm apart are used for exciting an electric field at a frequency of 13.56 MHz, for example using a 500 W power generator. The material on which the deposit is to be made is fixed to the upper plate and sheets of metal, such as gold, platinum, titanium, tungsten, etc are placed on the lower plate. Metallic atoms bombarded by $A^+$ argon ions produced by the gas discharge and present in the bell jar are deposited on the sample to be treated. The thus obtained deposits can be of the order of one to a few hundred Angstroms per minute and the properties of such deposits can be very good, both with regard to the purity of the deposit and its adhesion to the sample.

In other types of devices, a gaseous metallic composition is introduced at a suitable pressure into an enclosure in which is placed the material on which the deposit is to be made. An electric discharge of suitable frequency makes it possible to release the metal by decomposition of the gaseous mixture. As stated hereinbefore, the frequency range of the useful discharges extends up to about 50 MHz.

Moreover, there are other types of devices using ultra-high frequency discharges to obtain a surface cleaning action by erosion. The bombardment of chemically neutral species (rare gases) is used for this purpose. To obtain this effect, bombardment is carried out by high energy particles. Such ultra-high frequency discharges permit the bombardment of surfaces to be cleaned by erosion using ions which can reach very high energy levels, e.g. about 1 kV.

BRIEF SUMMARY OF THE INVENTION

The invention relates to a device for depositing thin films on solid materials comprising means for producing by ultra-high frequency discharge fast electrons used outside their production zone to dissociate a gaseous compound incorporating the substance to be deposited, the material to be covered being placed in a zone where the gaseous compound is dissociated, but outside the intense high frequency excitation zone.

According to the invention, the ultra-high frequency device for depositing thin films on solids is characterized in that it comprises an elongated enclosure, means for exciting an electromagnetic field created in a limited area of the enclosure to form a plasma, a vacuum pump, means for injecting into the said enclosure a gaseous composition able to release the particles to be deposited after decomposition, the vacuum pump and the injection means having connections arranged on the enclosure on either side of the plasma, the gaseous composition injection flow rate and the pressure in the enclosure being such that most of the gaseous composition is decomposed between the injection connection and the high frequency excitation zone, the material on which the deposit is to be made being placed in the enclosure in the decomposition zone of the gas.

BRIEF DESCRIPTION OF THE DRAWINGS

The invention is described in greater detail hereinafter relative to non-limitative embodiments with reference to the attached drawings, showing:

FIG. 2 a second embodiment comprising a capacitor of suitable geometry for ultra-high frequency excitation.

FIG. 3 another embodiment of the device according to the invention incorporating a sheet-like enclosure.

DETAILED DESCRIPTION OF THE PREFERRED EMBODIMENTS

The device according to the invention makes it possible to produce high energy electrons permitting the effective decomposition of gaseous components and the deposition of decomposition products on surfaces positioned outside the area in which the high energy particles are produced. Thus, as the material to be treated is positioned outside the ion bombardment area, the effect used in certain types of device for cleaning the surfaces of materials by erosion cannot occur. However, as the dissociation of the gas molecules is performed very easily by means of the high energy particles from the excited zone, the deposition rates of the materials liable to be obtained are very high. For example, in the case of silicon deposits, deposition rates of approximately ½ micron per minute are obtained.

Figure 1:
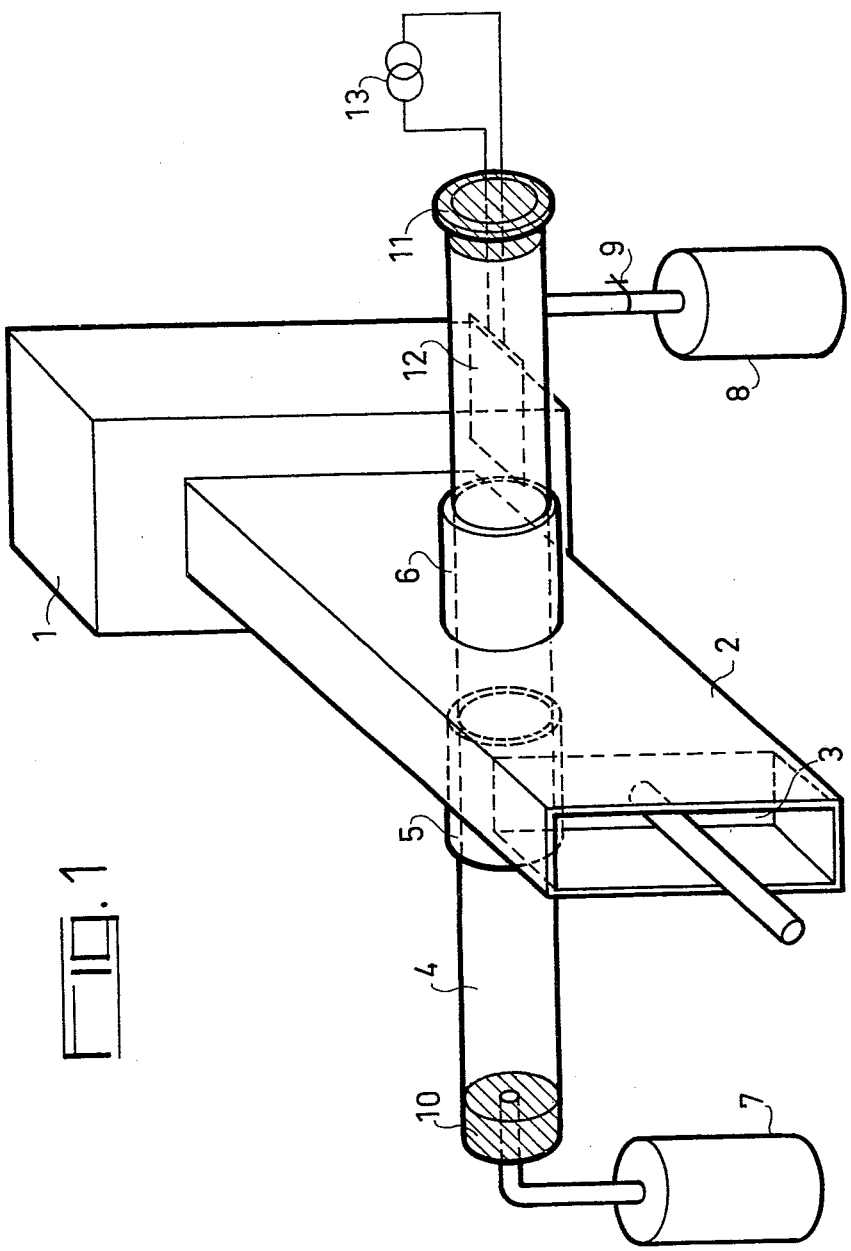
FIG. 1 a first embodiment of the ultra-high frequency device for the deposition of thin films incorporating an ultra-high frequency generator supplying a waveguide high frequency excitation.

The device shown in FIG. 1 comprises a tunable ultra-high frequency generator 1 able to supply a power of a few hundred Watts at a frequency of approximately 1000 MHz, e.g. 200 W at 1270 MHz. This ultra-high frequency generator excites a low impedance square wave guide 2 terminated by a moving short-circuit piston 3. This waveguide is traversed by a glass tube 4, whose axis is parallel to the electric field in the waveguide. In addition, the guide is provided with two sleeves 5 and 6 surrounding the glass tube level with the opening made in the waveguide. These two sleeves prevent electromagnetic field leaks. The glass tube 4 can also slide freely in the waveguide and associated sleeves.

One of the ends of the glass tube is connected to a vacuum pump 7. An opening is provided on the other part of the tube to which is connected a reservoir 8 of the gaseous mixture used. The gaseous flow introduced into the tube is regulated by means of a regulatable valve 9. The two ends of the tube are provided with removable stoppers 10, 11. These stoppers make it possible to introduce into the tube the elements onto which the deposits are to be made. They also make it possible to introduce resistance heating supports 12 connected to an external power supply 13 into the enclosure.

Such a device makes it possible to obtain a deposit either on an element deposited within the tube or directly on the inner wall of the tube itself.

This device operates in the following manner. On starting up the device, ionization is obtained by means of a Ruhmkorff coil. The discharge is maintained by means of the waveguide 2 supplied by the ultra-high frequency generator 1. Ionization is maintained in a relatively wide pressure range of $10^{-4}$ Torr to a few dozen Torr. The high energy particles, electrons, coming from the part of the tube located in the waveguide and in which the plasma is formed are emitted to the outside of the excited area and permit the decomposition of the gaseous compound with a great efficiency. Taking account of the high energy of these particles, a very large quantity of gaseous compound is dissociated before reaching the waveguide and therefore the plasma area. However, this dissociation can only be maintained if the free travel of the gas molecules is not too short, i.e. when the pressure does not exceed a few tenths of a Torr (typically 0.3 Torr).

The condensable products are deposited between the waveguide and the connection used for injecting the gaseous compound. Within the waveguide, no significant deposit is possibly to be controlled due to the ion bombardment of the tube walls in the said area. However, traces of this bombardment can be observed in this area.

An advantage of such a device is that, as the deposit is obtained externally of the ultra-high frequency field, said deposit cannot be excessively heated due to the said field and the deposit does not prevent electromagnetic propagation. Downstream of the waveguide, it is possible to observe a deposit of limited thickness compared with that obtained upstream of the guide relative to the gaseous compound injection point. This deposit results from the small quantity of gaseous compound in the downstream part of the tube.

In order to obtain a deposit on a solid element of small dimensions arranged within the tube, the element is placed immediately upstream of the waveguide and the gaseous compound injection connection is positioned immediately upstream of the element. Thus, the surface of the inner wall of the enclosure on which the deposit is made at the same time as on the element is reduced to a minimum.

However, to obtain a deposit over the entire inner wall of the glass tube, the gaseous compound injection connection is placed at the end of the tube opposite to that where the vacuum pump is positioned. During the starting up of the device, the tube is positioned in such a way that the gaseous compound injection connection is in the immediate vicinity of the plasma. Then, during operation, the tube slides in the waveguide and the associated sleeves in such a way as to displace the high frequency excitation zone relative to the tube, the deposition area varying correlatively. Thus, the entire inner wall of the glass tube can be covered with the desired material.

The device is particularly designed with a view to obtaining a silicon deposit. For this purpose, the gaseous compound used is formed from silane, to which is added hydrogen or argon. The ultra-high frequency generator used supplies a signal at frequency 1270 MHz, so that the diameter of the associated enclosure has been selected equal to 3.9 cm, with the ultra-high frequency wavelength being 23.62 cm. Thus, the diameter of the tube must not exceed a certain fraction of the wavelength and specifically 1/6 or at the upmost ¼ of the wavelength. As the ultra-high frequency generator used is tunable, it has been found that a frequency variation of ±150 MHz causes no appreciable modifications in the operation of the device. In this way, it has been possible to obtain deposits of a few dozen microns, which have been very homogeneous, have a polished metallic appearance and which are not subject to cleavage. It has even been possible to obtain compact layers with a thickness up to 0.6 mm in relatively short times. The reasons are that such a device has a very fast deposition rate and which can be up to a few thousand Angstroms per minute.

The numerical values given hereinbefore and which only correspond to a particular embodiment of the device can easily be adapted as a function of the desired deposition rate and as a function of the surface on which the deposit is to be made. In particular, it is possible to work in a different frequency band. There is no limit in the high frequency direction. It is known that the gas and electron densities permitted increase roughly with the square of the frequency of the generator used, but the dimensions of the enclosure which can be used decrease. Systems which use very high frequencies are well suited to rapid deposits on small surfaces. On the low frequency side, the limit is given by too large amplitudes of the electron movements. Below a few dozen MHz, the amplitudes necessary to enable electrons to reach a kinetic energy of about 20 electron volts are several cm, making it necessary to reduce the pressure. For an enclosure formed by a tube of diameter 20 cm, a frequency of 200 MHz is very suitable. It is therefore necessary to make a compromise between the dimensions of the elements on which it is desired to obtain the deposits and the deposition rate, as a function of the needs of the particular application.

For systems working at a relatively low frequency of a few dozen MHz, the necessary waveguides become very large. It is therefore necessary to use some other high frequency excitation means. The device shown in FIG. 2 corresponds to a second embodiment of the device according to the invention and can be used more particularly at relatively low frequencies (e.g. below 100 MHz). In FIG. 2, the same elements as in FIG. 1 are given the same reference numerals. Thus, the device has an enclosure 4 formed from a glass tube at the two ends of which are arranged respectively a vacuum pump 7, whose connection is provided on a removable stopper 10 sealing the tube, a gas reservoir 8 positioned at the other end permitting the injection of the gaseous compound into the glass tube by means of a regulatable valve, said second end of the tube also being sealed by a removable stopper 11. A heating support 12 supplied by a current generator 13 is also provided. The high frequency discharge is obtained by means of a capacitor formed from two rings 15 and 16 connected to an induction coil 17 excited by a generator 18 connected to a second coil 19. The two rings forming the capacitor are extended, as was previously the case with the waveguide, by two sleeves 5 and 6. Like the device shown in FIG. 1, this device makes it possible to produce a plasma in a limited area of an enclosure. This enclosure is shown in the form of a cylindrical tube, which corresponds to a particular embodiment. However, it is also possible to use an interaction region between the high frequency excitation zone and the gaseous compound which is no longer cylindrical and instead has a sheet-like configuration.

FIG. 3 shows an embodiment of a device having a flat enclosure in which the excitation is obtained by means of a waveguide. As hereinbefore, the same elements are given the same reference numerals as in FIG. 1 or 2. Thus, this device has an ultra-high frequency generator 1 associated with a square wave guide 2 sealed by a moving short-circuiting piston 3. The enclosure is a flat enclosure extending in the propagation direction of the electromagnetic wave in the guide. Thus, the dimensioning rule for the enclosure with respect to the wavelength of the ultra-high frequency signal referred to hereinbefore concerning the maximum diameter of the tube which can be used is in fact only imposed in a plane orthogonal to the propagation direction of the electromagnetic waves. It is therefore possible to use an enclosure, whose thickness does not exceed quarter the wavelength of the ultra-high frequency wave and the length of said enclosure in the waveguide propagation direction is not limited. As in the preceding embodiments, the enclosure is sealed by two removable stoppers 10 and 11, one communicating with a vacuum pump 7 and the other with a gaseous compound reservoir 8, whose flow rate is regulatable by means of a valve 9. The sheet can be opened to permit the introduction of objects to be coated and a vacuum-tight disassemblable joint 20 is provided. To prevent electromagnetic field leaks of the waveguide, two sleeves 50 and 60, optionally having traps, are associated with the waveguide and surround sheet 40. Such a device is particularly suitable for the coating of planar objects, for example for applying passivating coatings. As in the previous embodiments, the enclosure can slide relative to the plasma so as to displace the decomposition zone of the gaseous compound within the enclosure. Such a device makes it possible to coat extensive objects with the desired deposit.

Figure 4:
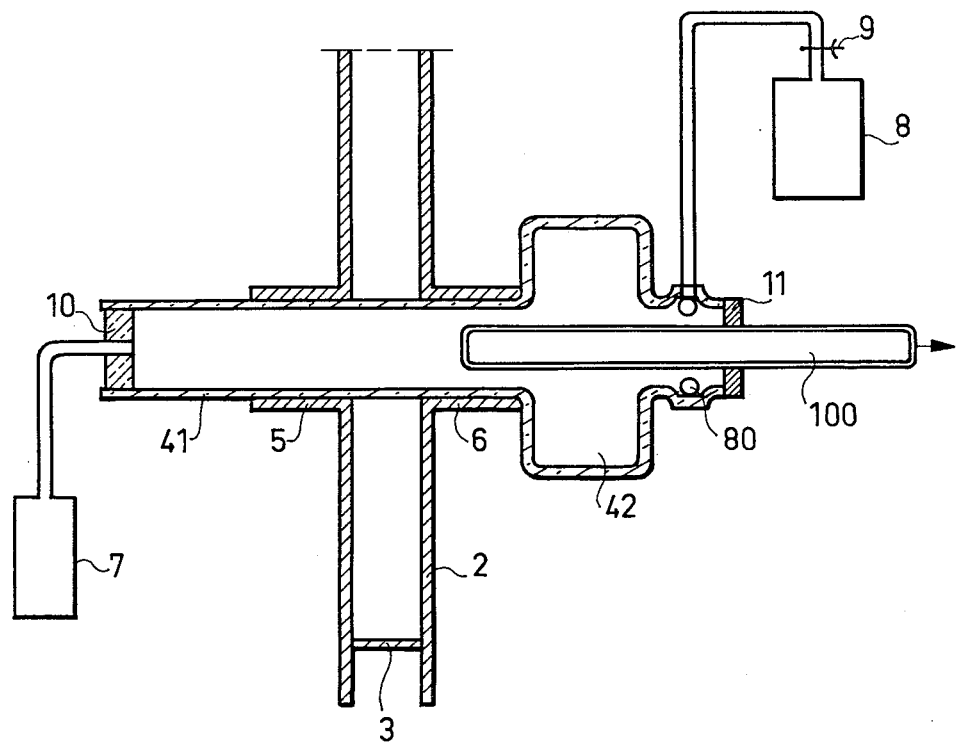
FIG. 4 in section, another embodiment of the device according to the invention.

FIG. 4 is a sectional view of another embodiment of a device according to the invention in which the enclosure is fixed relative to the high frequency excitation region. The object to be coated can slide relative to the enclosure and therefore relative to the depositon zone, which remains fixed.

As hereinbefore, the device comprises a waveguide 2, sealed by a moving piston 3 and which can be supplied by a not shown ultra-high frequency generator. Two sleeves 5 and 6 are also provided, as is a vacuum pump 7, whose connection is located at one end of enclosure 41.

The object to be coated is a tube 100 and the deposit is to be made on the outer wall. This tube is able to slide through a stopper 11 and there is a tightly sealed joint between the stopper and the tube. The gaseous compound is stored in a reservoir 8 and injected into the enclosure 41 by an annular distribution means 80 making it possible to render uniform the distribution of the gaseous compound in the said enclosure. The deposition region 40 in which gas decomposition takes place can have a random configuration.

In order to obtain a very uniform deposit it is possible to regulate the device in such a way that the deposition rate is not too fast. Very homogeneous deposits without any cleavage can be obtained by effecting more than one sweep, the object to be covered being moved at a constant speed with respect to the decomposition zone, either by moving the enclosure in which the object is fixed or by moving the object itself. The part which has just been covered must be displaced by moving it away from the high frequency excitation zone.

Moreover, by applying a magnetic field in the axis of the tube forming the enclosure, it is possible to modify the distribution and composition of the deposit. Thus, in this case, as the ions and electrons are trapped along the magnetic field lines and as said field lines are directed in accordance with the tube axis, it is possible to reduce the pressure compared with pressure necessary in the absence of the field. By working at a lower pressure, it is then possible to modify the composition of the deposit compared with that which would be obtained at a higher pressure and at the same time to reduce the deposition rate.

The device according to the invention is more particularly applicable to obtaining absorbant deposits on glass tubes for systems for converting solar energy into thermal energy.

In the case where the gaseous compound used is a mixture of silane, hydrogen and argon, the amorphous silicon deposit obtained contains hydrogen. By carrying out a supplementary treatment such deposits can be used in photovoltaic converters in the field of panels with solar cells. As a result of electron impacts, silane $SiH_4$ is decomposed into $SiH_2$ and hydrogen. If the impacts are more numerous, the $SiH_2$ molecules can also give rise to $SiH$ molecules. Thus, the deposit obtained has a hydrogen content which is variable as a function of the operating conditions of the device, i.e. pressure, temperature etc. It is then possible to regulate the different parameters of the device so as to obtain a maximum deposition rate. Then, if it is necessary to obtain a deposit having the desired hydrogen content characteristics, a supplementary treatment is performed, either by heating to reduce the hydrogen content, or by treating in an atomic hydrogen atmosphere to increase the said content.

The invention is not limited to the embodiments of the device described and represented herein. In particular, for deposits on tubes, the embodiments have been described with either a displacement of the gas decomposition zone relative to the tube or a displacement of the tube relative to the decomposition zone. It is also possible to combine these two displacements. Moreover, in order to create a high frequency excitation zone in the enclosure, a square wave guide has been described, but this shape is not limitative. Moreover, with regard to the deposits, numerous types of deposits can be obtained. It is possible, for example, to deposit boron nitride and passivate various materials.

What is claimed is:

1. An ultra-high frequency device for depositing thin films on solids, wherein it comprises an elongated enclosure, means for exciting an ultra-high frequency electromagnetic field created in a limited zone of the enclosure, a vacuum pump, means for injecting into the said enclosure a gaseous compound able to release the particles to be deposited after decomposition, whereby the vacuum pump and the injection means having connections positioned on the enclosure on either side of the high frequency excitation zone, the injection flow rate of the gaseous compound and the pressure in the enclosure being such that most of the gaseous compound is decomposed in an area between the injection connection and the excitation zone, the material on which the deposit is to be made being placed in the enclosure in said gas decomposition zone.

2. A device according to claim 1, wherein the excitation means comprise an ultra-high frequency waveguide and an ultra-high frequency generator associated therewith, the elongated enclosure traversing the waveguide in such a way as to create an excitation zone in the area common to the enclosure and to the waveguide.

3. A device according to claim 1, wherein the excitation means comprise a capacitor formed from parallel electrodes traversed by the elongated enclosure, an excitation coil connected to the electrodes of the capacitor and a high frequency generator supplying the thus formed oscillating circuit to create a high frequency excitation zone in the are a common to the capacitor and the elongated enclosure.

4. A device according to claims 2 or 3, wherein the elongated enclosure is a tube, whose axis is parallel to the electric field in the high frequency excitation zone.

5. A device according to claim 4, wherein in order to effect a deposit on the inner wall of the tube forming an enclosure, means are provided so that the tube slides relative to the high frequency excitation zone, the end of the tube into which is injected the gaseous compound being initially placed in the vicinity of the high frequency excitation zone in the decomposition area and is then moved away, the inner walls of the tube thus being located in the area of the decomposition.

6. A device according to claim 4, wherein in order to effect a deposit on the outer surface of a solid material, the enclosure has means for introducing the material into the enclosure and optionally means for displacing the material relative to the high frequency excitation zone and the adjacent decomposition area of the gaseous compound.

7. A device according to claim 1, wherein heating means connected to an external power supply are positioned within the enclosure.

8. An ultra-high frequency apparatus for depositing thin films on solids comprising
(a) an elongated enclosure,
(b) means for creating an ultra-high frequency electromagnetic field in a limited zone of the enclosure and for exciting a gaseous compound there in,
(c) a vacuum pump,
(d) means for injecting into said enclosure a decomposable gaseous compound able to release particles to be deposited after decomposition,
the vacuum pump and the injection means being connected to the enclosure on either side of the zone,
(e) means for regulating the injection flow rate of the gaseous compound and the pressure in the enclosure so that most of the gaseous compound is decomposed in an area between the injection connection and the high frequency zone,
(f) means for placing the material on which the deposit is to be made in the enclosure in said gas decomposition area which is between said injection connection and said high frequency zone.

9. An apparatus according to claim 8 wherein said ultra-high frequency electromagnetic field is in the 1000 MHz range.

10. An apparatus according to claim 9 wherein said deposited film is silicon, and said gaseous compound comprises silicon-hydrogen molecules.

* * * * *